United States Patent
Lue et al.

(10) Patent No.: US 8,860,124 B2
(45) Date of Patent: Oct. 14, 2014

(54) DEPLETION-MODE CHARGE-TRAPPING FLASH DEVICE

(75) Inventors: Hang-Ting Lue, Hsinchu (TW); Yi-Hsuan Hsiao, Budai Township, Chiayi County (TW)

(73) Assignee: Macronix International Co., Ltd., Hsinchu (TW)

( * ) Notice: Subject to any disclaimer, the term of this patent is extended or adjusted under 35 U.S.C. 154(b) by 638 days.

(21) Appl. No.: 12/553,758

(22) Filed: Sep. 3, 2009

(65) Prior Publication Data

US 2010/0176438 A1 Jul. 15, 2010

Related U.S. Application Data

(60) Provisional application No. 61/144,934, filed on Jan. 15, 2009.

(51) Int. Cl.
*H01L 29/66* (2006.01)
*H01L 27/115* (2006.01)
*H01L 29/51* (2006.01)
*H01L 29/792* (2006.01)
*G11C 16/04* (2006.01)

(52) U.S. Cl.
CPC ........ *H01L 29/792* (2013.01); *H01L 27/11568* (2013.01); *G11C 16/0483* (2013.01); *H01L 29/513* (2013.01)
USPC .................... 257/325; 257/326; 257/E27.103

(58) Field of Classification Search
USPC ................................. 257/325, 326, E27.103
See application file for complete search history.

(56) References Cited

U.S. PATENT DOCUMENTS

| | | | |
|---|---|---|---|
| 5,574,685 A | 11/1996 | Hsu | |
| 5,981,404 A | 11/1999 | Sheng et al. | |
| 6,642,090 B1 | 11/2003 | Fried et al. | |
| 6,657,252 B2 | 12/2003 | Fried et al. | |
| 6,812,075 B2 | 11/2004 | Fried et al. | |
| 6,815,268 B1 | 11/2004 | Yu et al. | |
| 6,864,139 B2 | 3/2005 | Forbes | |
| 7,244,651 B2 | 7/2007 | Wu et al. | |
| 7,262,084 B2 | 8/2007 | Zhu et al. | |
| 7,298,004 B2 | 11/2007 | Specht et al. | |
| 7,314,787 B2 | 1/2008 | Yagishita | |
| 7,426,140 B2 | 9/2008 | Lue | |
| 7,442,988 B2 | 10/2008 | Oh et al. | |
| 7,646,056 B2 | 1/2010 | Choi et al. | |
| 2004/0051133 A1* | 3/2004 | Sugita et al. | 257/315 |

(Continued)

OTHER PUBLICATIONS

Hwang, Jiunn-Ren et al., "20nm Gate Bulk-FinFET SONOS Flash," IEEE 2005, 4 pages.

(Continued)

*Primary Examiner* — Hsin-Yi Hsieh
(74) *Attorney, Agent, or Firm* — Haynes Beffel & Wolfeld LLP

(57) ABSTRACT

A memory device includes a plurality of semiconductor lines, such as body-tied fins, on a substrate. The lines including buried-channel regions doped for depletion mode operation. A storage structure lies on the plurality of lines, including tunnel insulating layer on the channel regions of the fins, a charge storage layer on the tunnel insulating layer, and a blocking insulating layer on the charge storage layer. A plurality of word lines overlie the storage structure and cross over the channel regions of the semiconductor lines, whereby memory cells lie at cross-points of the word lines and the semiconductor lines.

16 Claims, 6 Drawing Sheets

(56) References Cited

U.S. PATENT DOCUMENTS

| | | |
|---|---|---|
| 2004/0207002 A1 | 10/2004 | Ryu et al. |
| 2004/0251487 A1 | 12/2004 | Wu et al. |
| 2005/0272190 A1 | 12/2005 | Lee et al. |
| 2006/0029887 A1 | 2/2006 | Oh et al. |
| 2006/0097310 A1 | 5/2006 | Kim et al. |
| 2006/0284245 A1 | 12/2006 | Park et al. |
| 2007/0267687 A1* | 11/2007 | Lue ............... 257/321 |
| 2008/0031050 A1* | 2/2008 | Yoon et al. ........ 365/185.18 |
| 2008/0054346 A1* | 3/2008 | Saitoh et al. ......... 257/324 |
| 2008/0087942 A1 | 4/2008 | Hsu et al. |
| 2008/0087946 A1 | 4/2008 | Hsu et al. |
| 2008/0150029 A1 | 6/2008 | Zheng et al. |
| 2008/0157176 A1 | 7/2008 | Kim et al. |
| 2008/0203491 A1* | 8/2008 | Anderson et al. ........ 257/372 |
| 2008/0265308 A1 | 10/2008 | Lee |
| 2008/0291726 A1 | 11/2008 | Lue et al. |

OTHER PUBLICATIONS

Shin, Yoocheol et al., "A Novel NAND-type MONOS Memory using 63nm Process Technology for Multi-Gigabit Flash EEPROMs," IEEE 2005, 4 pages.

Shin, Yoocheol et al., "High Reliable SONOS-type NAND Flash Memory Cell with Al2O3 for Top Oxide," Non-Volatile Semiconductor Memory Workshop, 2003, 2 pages.

* cited by examiner

DEPLETION-MODE CHARGE-TRAPPING FLASH DEVICE

RELATED APPLICATIONS

This application claims the benefit of U.S. Provisional Application Ser. No. 61/144,934 filed 15 Jan. 2009.

BACKGROUND OF THE INVENTION

1. Field of the Invention

The present invention relates to charge trapping memory devices, including charge trapping memory device used in a NAND flash configuration.

2. Description of Related Art

Flash memory is a class of non-volatile integrated circuit memory. Traditional flash memory employs floating gate memory cells. As the density increases in memory devices, and the floating gate memory cells get closer and closer together, interference between the charge stored in adjacent floating gates becomes a problem. This is limiting the ability to increase the density of flash memory based on floating gate memory cells. Another type of memory cell used for flash memory can be referred to as a charge trapping memory cell, which uses a dielectric charge trapping layer in place of the floating gate. Charge trapping memory cells use dielectric charge trapping material that does not cause cell-to-cell interference to the degree encountered with floating gate technology, and can be applied for higher density flash memory.

The typical charge trapping memory cell consists of a field effect transistor FET structure having a source and drain separated by a channel, and a gate separated from the channel by a stack of dielectric material including a tunneling dielectric layer, the charge storage layer, and a blocking dielectric layer. According to the early conventional designs referred to as SONOS devices, the source, drain and channel are formed in a silicon substrate (S), the tunneling dielectric layer is formed of silicon oxide (O), the charge storage layer is formed of silicon nitride (N), the blocking dielectric layer is formed a silicon oxide (O), and the gate comprises polysilicon (S). The SONOS device is programmed by electron tunneling using one of a number of well-known biasing technologies, and erased by hole tunneling or electron de-trapping.

One focus of investigation for charge trapping memory cells has been on NAND style architectures. See, for example, Shin et al., "A Highly Reliable SONOS-type NAND Flash Memory Cell with Al2O3 or Top Oxide," IEDM, 2003 (MANOS); and Shin et al., "A Novel NAND-type MONOS Memory using 63 nm Process Technology for a Multi-Gigabit Flash EEPROMs", IEEE 2005.

In a NAND style architecture, the memory cells are arranged in series so that current used for reading data passes through a string of memory cells. This path through the cells limits the amount of current and the speed at which the read operation can be accomplished.

The present inventors have been involved in the development a charge trapping memory using bandgap engineered charge trapping technology, referred to as BE-SONOS. A variety of embodiments of BE-SONOS memory cells can be seen in U.S. Pat. No. 7,426,140 B2 by Lue, and in U.S. Patent Application Publication No. US2007/0029625 by Lue et al. BE-SONOS is characterized by the ability to block charge tunneling at relatively low electric fields, while enabling very efficient tunneling at moderately high electric fields. BE-SONOS also has very good endurance and reliability characteristics. BE-SONOS technology has been proposed for finFET non-volatile memory as well in U.S. Patent Application Publication No. US 2008/0087946 by Hsu et al., and U.S. Patent Application Publication No. US 2008/0087942 by Hsu et al.

One problem with charge-trapping devices arises because the memory windows are generally shifted upward toward positive $V_T$ as compared with the floating gate NAND flash. This causes difficulty in circuit design, since a higher pass gate voltage is required. Techniques are used to push the erased state memory window negative, such as by using high work function gates and other technologies. However, the tendency to operate with higher threshold levels remains a problem.

It is desirable to provide a dielectric charge trapping cell improves NAND architecture performance, and can be readily manufactured.

SUMMARY OF THE INVENTION

An integrated circuit memory device described herein includes charge trapping memory cells arranged in a finFET-like configuration having a buried-channel region doped for depletion mode operation. Thus, for n-channel cells, the buried-channel has n-type dopants establishing a normally "on" condition for the cells. Charge trapping structures over the buried-channel can store charge to induce one or more high threshold states with positive threshold voltages $V_T$, and a low threshold state with a negative threshold voltage $V_T$ (i.e., normally on). The structure can be implemented in a "junction-free" configuration, where the buried-channel region extends as a continuous region across a plurality of cells, without intervening source/drain regions having higher doping concentrations. Alternatively, source/drain regions can be implemented. As a result of the buried-channel, the upward shift of threshold voltage $V_T$ in traditional dielectric charge trapping cells is offset. The memory device described herein is suitable for a NAND architecture flash memory.

A basic memory device as described includes a plurality of semiconductor lines on a substrate, the lines including buried-channel regions doped for depletion mode operation. A storage structure lies on the plurality of lines, including tunnel insulating layer on the channel regions of the fins, a charge storage layer on the tunnel insulating layer, and a blocking insulating layer on the charge storage layer. A plurality of word lines overlie the storage structure and cross over the channel regions of the semiconductor lines, whereby memory cells lie at cross-points of the word lines and the semiconductor lines. In a substrate-tied, finFET-like embodiment, the substrate comprises a semiconductor body, and the plurality of semiconductor lines comprise distal ridges of fins integral with and extending out of said semiconductor body. The distal ridges of the fins are isolated from the substrate by doping having a conductivity type opposite that of the buried-channel regions. In alternatives, the semiconductor lines are isolated from the substrate by insulating structures or otherwise.

A memory device described below includes a NAND cell comprising a semiconductor fin, which extends away from a substrate with a distal ridge, where the fin includes a buried-channel region along the distal ridge (on the top and/or on one or both sides of the ridge). The buried-channel is doped with n-type dopant for depletion mode operation. A plurality of memory cell gates (such as parts of word lines) is arranged over the buried-channel region along the distal ridge of the fin, the plurality of gates including a first memory cell gate and a last memory cell gate. Dielectric charge trapping locations lie beneath more than one (e.g. 16 or 32) of the plurality of memory cell gates. The charge trapping locations include a multilayer tunnel insulating structure, a charge storage layer disposed above the tunnel insulating structure, and a blocking insulating layer disposed above the charge storage layer. A string select gate is positioned over the distal ridge of the fin, and spaced away from the first memory cell gate, and having a p-type channel region on the distal ridge of the fin.

The tunnel insulating structure can be a band-gap engineered insulator to facilitate hole tunneling erase operations. The band-gap engineered insulator is characterized by comprising a combination of materials arranged to establish a relatively low valence band energy level near the surface of the channel region, and an increase in valence band energy level at a first distance of less than 2 nanometers (nm) from the surface of the channel region and a decrease in valence band energy at a second distance more than said first distance from the surface of the channel region. In an example band-gap engineered insulator, the combination of materials includes a bottom layer of silicon oxide having a thickness less than 2 nm, a middle layer of silicon nitride having a thickness less than 2.5 nm and a top layer of silicon oxide having a thickness less than 2.5 nm.

Other aspects and advantages of the present invention can be seen on review of the drawings, the detailed description and the claims, which follow.

DETAILED DESCRIPTION

A detailed description of embodiments of the present invention is provided with reference to the FIGS. 1-7.

Figure 1:
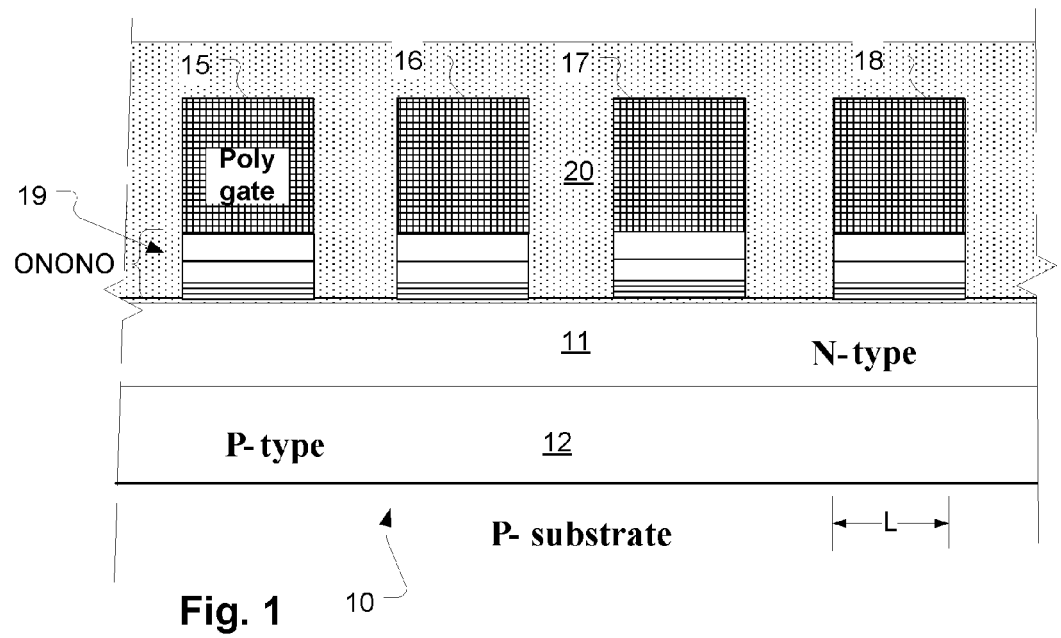
FIG. 1 is a simplified cross-section of a string of buried-channels memory cells along the distal ridge of a fin as described herein, in a junction-free embodiment, taken for example along the line 1a-1b of FIG. 3.

FIG. 1 is a cross-section view taken along a fin on a semiconductor body having a string of four memory cells at cross-points of the fin and a plurality of word lines 15-18. The fin is coupled at a proximal edge to a substrate 10, which is p-type in this embodiment. The distal ridge of the fin has a buried-channel region 11 doped for depletion mode operation. Thus, for n-channel memory cell, the buried-channel region 11 has n-type doping. Typical n-type channel doping is around $5 \times 10^{17}$ cm$^{-3}$ to $1 \times 10^{18}$ cm$^{-3}$, and the n-type channel depth can be about 30 nm. The buried-channel region 11 is isolated from the p-type substrate 10 by a more heavily doped, isolation region 12 on the neck of the fin. The plurality of word lines 15-18 is covered by an interlayer dielectric 20. The word lines 15-18 are preferably formed of a p+-type polysilicon, or other relatively high work function material to lower erase saturation levels. Data storage structures (e.g. 19) are formed between the word lines 15-18 and the buried-channel region 11, so that memory cells are formed at the cross-points. In this example, the data storage structure is an ONONO structure, including a multilayered tunneling insulator (ONO) on the surface of the buried-channel region, a silicon nitride charge trapping layer and a silicon oxide blocking layer. More details of the preferred data storage structure are provided below with reference to FIG. 6. The gate length dimension L labeled in FIG. 1, which corresponds to the width of the word line, is preferably very small, with representative gate length dimensions in a range of about 30 to 100 nm. Although the storage structures (e.g. 19) are shown as separate stacks in the figure, in other embodiments, the storage structure can be implemented as a sequence of blanket layers.

Figure 2:
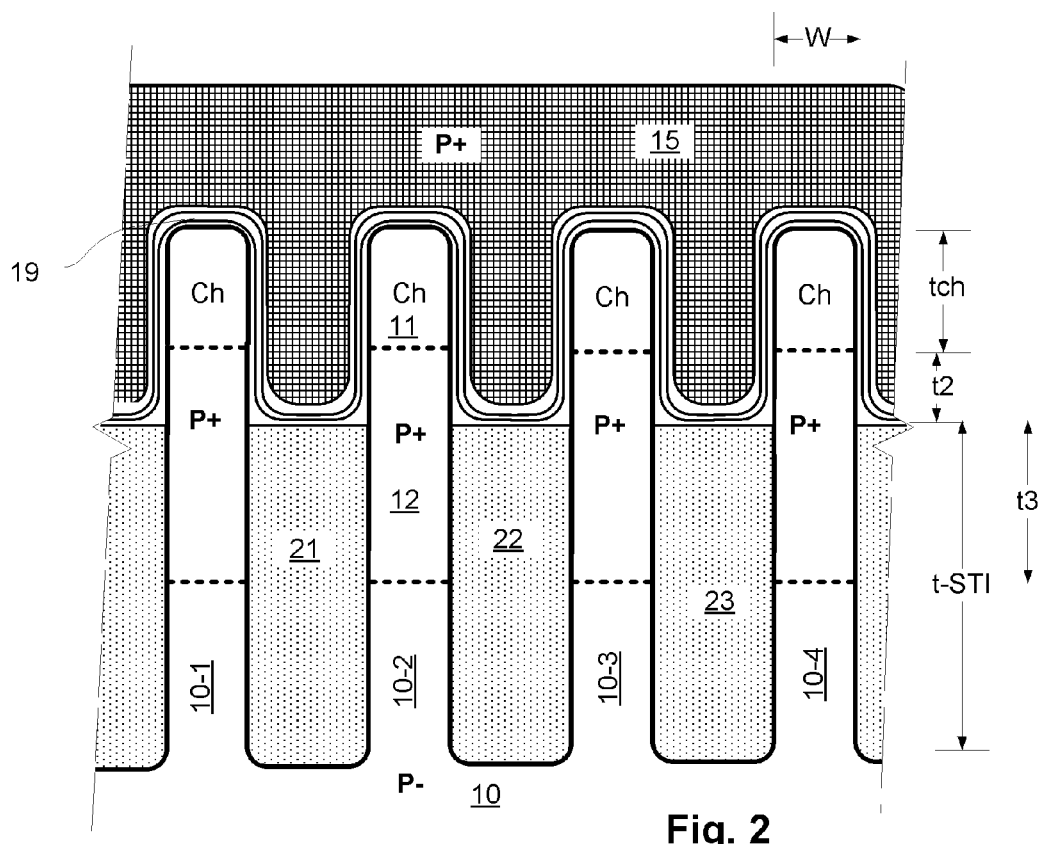
FIG. 2 is a simplified cross-section of a string of buried-channel memory cells taken across the fins, for example along the line 2a-2b of FIG. 3.

FIG. 2 is a cross-section view taken across a plurality of fins on a semiconductor body, including four fins 10-1, 10-2, 10-3 and 10-4 in this example. In the illustrated example, the fins are so-called body-tied having proximal edges integral with us underlying substrate 10. The neck region 12 of the fins has a p+-type doping, in order to isolate the fins by suppressing formation of parasitic devices in the substrate 10 between them. A word line 15 over lies charge storage structure 19 as shown. Insulating trenches 21, 22, 23 separate the individual fins 10-1 through 10-4. The fin width dimension W labeled in FIG. 2, is preferably quite small, with representative fin widths W on the order of 30 to 50 nm. The thickness tch of the buried-channel region labeled in the figure can be on the order of 30 nm. The thickness t-STI of the insulating trenches can be about 300 nm. The thickness of the p+-type isolation region 12 can be on the order of 180 nm, with a thickness t2 of about 30 nm extending above the surface of the insulating trenches and a thickness t3 below the surface of the insulating trenches. Representative doping concentrations for the buried-channel region using n-type dopants can be $10^{17}$/cm$^3$ to $10^{18}$/cm$^3$. A representative doping concentration for the isolation region can be about $2 \times 10^{18}$/cm$^3$.

In alternative embodiments, the fins can be isolated from the substrate by an insulating layer, forming semiconductor lines separated from the substrate 10.

Figure 3:
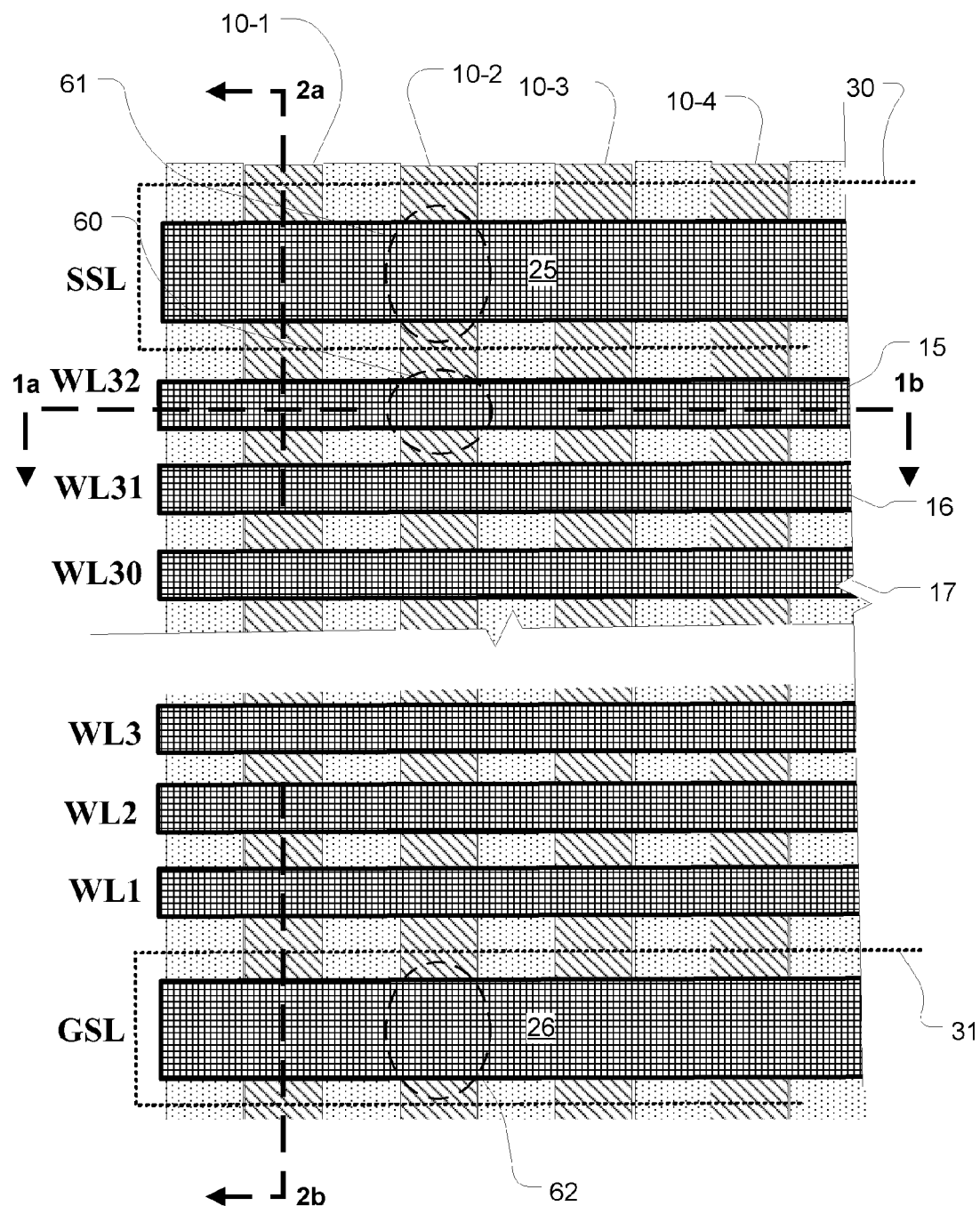
FIG. 3 is a layout view of a portion of a NAND array comprising buried-channel memory cells as described here.

FIG. 3 provides a layout view for a portion of a NAND architecture flash memory array including buried-channel devices as described here. In the layout, semiconductor lines 10-1 through 10-4 are arranged vertically on the page. FIG. 1 is a cross-section taken along the line 1a-1b in FIG. 3. FIG. 2 is a cross-section taken along the line 2a-2b in FIG. 3.

A plurality of word lines WL1 to WL32 over lies the plurality of fins, where word lines WL32, WL31 and WL30 are labeled with the reference numerals 15-17, corresponding with similar structures in FIGS. 1 and 2. A memory cell 60 is formed at the cross-point of the word line WL32 and the semiconductor line 10-2. FIG. 3 illustrates a string select line SSL 25 and a ground select line GSL 26 on opposite sides of the plurality of word lines WL1-WL32. The channel regions beneath the SSL 25 and the GSL 26 are p-type in preferred systems, so transistors at the cross-points of the fins and the SSL and GSL lines 25, 26 (e.g. 61, 62) operate in an enhancement mode having a positive threshold voltage $V_T$. The semiconductor lines are coupled via contacts (not shown) to overlying (or underlying) bit lines and ground lines on the ends opposite the SSL 25 and GSL 26, respectively.

In manufacturing, an additional mask (including areas 30, 31) can be used to isolate the channel regions beneath the SSL and GSL lines from the n-type doping used to establish buried-channel regions in the memory cells, and as well to allow for formation of gate oxides having a structure, such as a single layer of silicon oxide or other gate insulator, different from that of the data storage structure 19. It is possible to use gate oxides in the SSL and GSL transistors that are of the same structure as the data store structure in some embodiments. Using p-type doping in the channels of the SSL/GSL transistors maintains a relatively high threshold voltage $V_T$ for the string select transistors.

Figure 4:
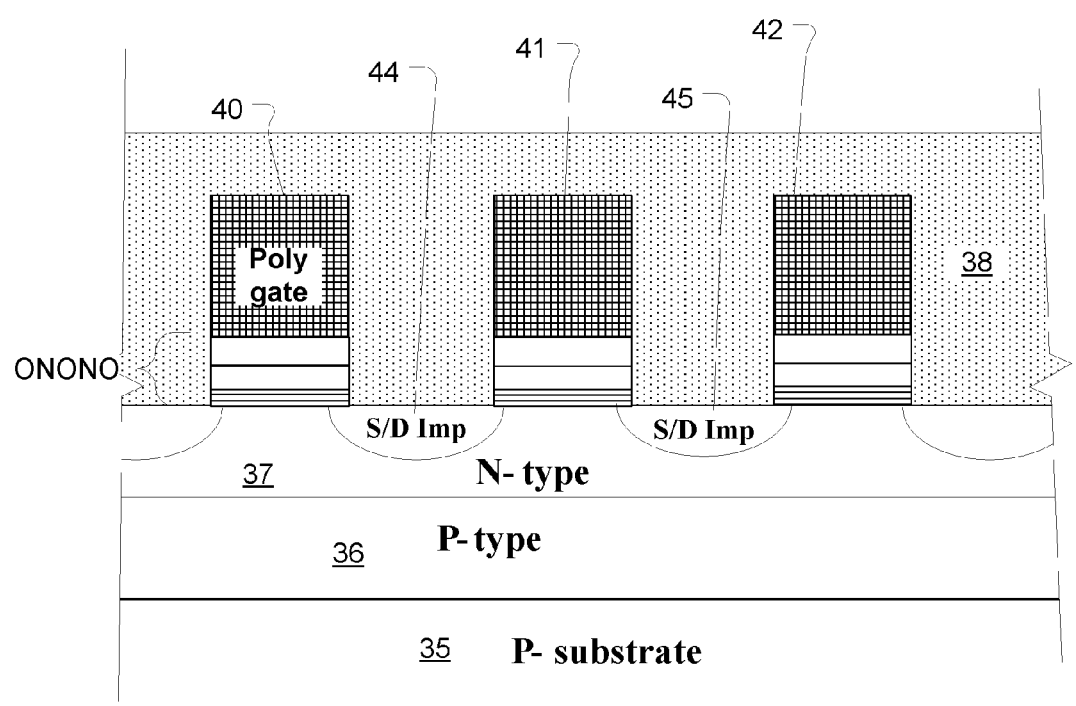
FIG. 4 is a simplified cross-section of a string of buried-channel memory cells, in an alternative in which source/drain junctions are implanted between the word lines.

FIG. 4 is a cross-section along a semiconductor line of an alternative embodiment in which source/drain implants are used to form junctions 44, 45 in the buried-channel region 37 between the gates 40, 41, 42 to enhance conductivity along the line. As in the example shown in FIG. 1, a body-tied fin includes a neck region 36 having a p+-type doping to isolate the buried-channel region 37 from the underlying substrate 35. However, as shown in junction-free structure shown in FIG. 1, such implants are not necessary in some embodiments as the conductivity of the buried-channel region is sufficient for high-performance operation of the NAND cells.

A body-tied finFET structure can be manufactured using techniques described in detail in U.S. Patent Application Publication No. US 2008/0087942, entitled VERTICAL CHANNEL MEMORY AND MANUFACTURING METHOD THEREOF AND OPERATING METHOD USING THE SAME, which application is incorporated by reference. According to one process, a substrate is provided, and a first layer of silicon nitride is formed over the substrate. The substrate is a p-type substrate for n-channel devices and a n-type substrate for p-channel devices. Optionally, a pad silicon oxide layer can be formed between the substrate and the first layer of silicon nitride. A pattern is formed in the first silicon nitride layer using a photo lithographic process for example, to define lines of silicon nitride on the substrate, where the lines are masks corresponding to the fins. Preferably, the lines of silicon nitride are trimmed using anisotropic etching or otherwise to create more narrow lines. Then, using the silicon nitride lines as etch masks, the substrate is etched to create a plurality of fins, having lines of pad oxide and silicon nitride on the distal ridges. A silicon oxide fill 38 is deposited between the ridges, filling a portion of the trenches between the fins without completely filling them. A deposit and etch back process can be used. Also, the lines of pad oxide and silicon nitride are removed from the distal ridges of the fins. In an alternative, the pad oxide may be left on the distal ridge of the fin, confining the channel regions to the side walls of the fins near the distal ridge. In a next step, a data storage structures are formed by depositing a sequence of blanket layers, including silicon oxide, silicon nitride, silicon oxide, silicon nitride, silicon oxide ONONO, covering the plurality of fins. A layer of word line material, such as polysilicon, is formed over the blanket ONONO layers. The word line material is etched to define word lines crossing over the plurality of fins thereby establishing memory cells at the cross-points.

The n-type buried-channel region can be formed in a lightly doped structure along the distal ridges of the fins, by providing a implantation step before formation of the blanket ONONO layers, or as an additional epitaxial silicon or thin-film growth process with in situ doping prior to deposition of the pad oxide and first silicon nitride layer, in order to provide a sharper doping profile. An alternative embodiment, an implant can be carried out after formation of the blanket ONONO layers. Using the implant after formation of the blanket ONONO layers, the channel doping will be exposed to a lower thermal budget, and have a better doping profile.

Figure 5:
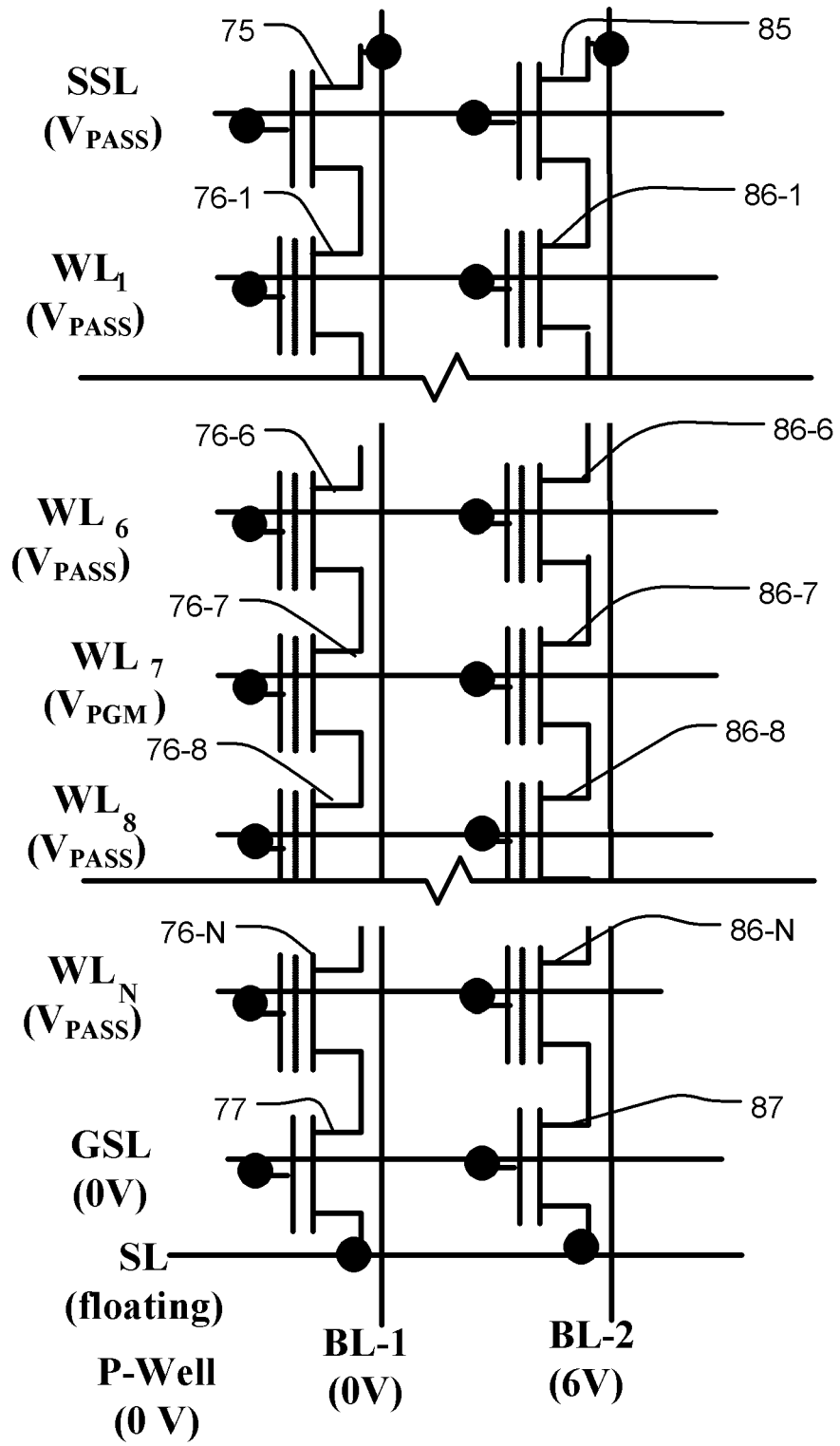
FIG. 5 is a schematic circuit diagram of two NAND strings using buried-channel memory cells as described here, with a programming bias arrangement illustrated.

FIG. 5 is a schematic diagram of two NAND strings which can be implemented as described here. The first string is coupled to bit line BL-1 by the SSL transistor 75 which is controlled by the SSL line. Memory cells 76-1 through 76-N are coupled in series, and controlled by corresponding word lines WL1 through WLN. A ground select transistor 77 couples the buried-channel region of the memory cells 76-1 through 76-N to a source line SL. Memory cells 86-1 through 86-N form the second string which is coupled to the bit line BL-2 by the SSL transistor 85. Ground select transistor 87 couples the second NAND string to the source line SL.

NAND flash memory operates by "reading through" a string of devices connected in series, such as the devices 75, 76-1 through 76-N and 77 in order to read a selected one of the memory cells 76-1 through 76-N. Using the technology described here with buried-channels, the sequence of buried-channels can act like a buried bit line to distribute voltages to memory cells along the string, and lower pass gate voltages (e.g. less than 5 V) can be used. Thus, program and read disturb characteristics are generally improved. In addition, in some embodiments, an additional source/drain junctions, as shown in the alternative of FIG. 4, may not be required.

Figure 6:
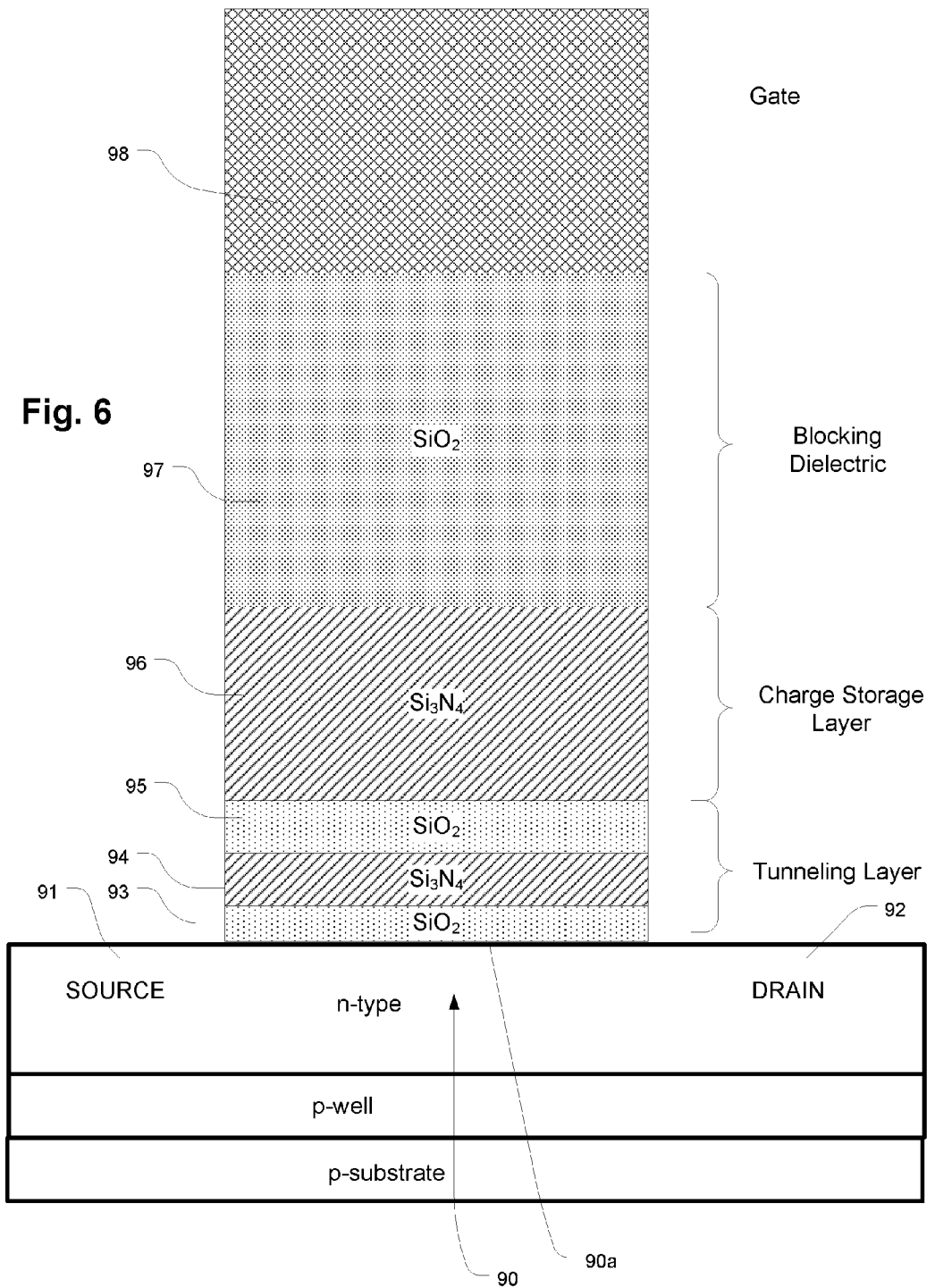
FIG. 6 is a cross-section of a buried-channel memory cell as described here, illustrating the data storage structure in a preferred BE-SONOS embodiment.

A programming bias arrangement is shown in the drawing, which can be generated and applied using the structures on the integrated circuit that are illustrated in FIG. 6 for example. The programming bias arrangement need not involve complicated self-boosting program-inhibit methods. Self-boosting is a complicated function of well and junction doping, and highly affected by junction leakage. The design trade-offs between cell performance and self boosting performance during well and junction profile adjustments are difficult. Thus, unlike the self-boosting techniques of the prior art, which must introduced deep depletion for self-boosting, it is very easy to directly raise the bit line potential in the buried-channel device, where all of the n-type channels are linked together. Thus, in order to program a memory cell, such as memory cell 76-7, a program voltage is applied to word line WL7, such as about positive 16 V to 20 V pulses have a duration on the order of 200 µs. Bit line BL-1 is grounded. Pass voltages VPASS of 5 V to 9 V, are applied to all of the other word lines in the string, as well as to the SSL line. The GSL line receives a ground potential, and the source line is left floating. The semiconductor body p-well is grounded. Meanwhile, the bit line BL-2 is coupled to an inhibit voltage, such as about 6 V directly coupling the inhibit voltage to the memory cells 86-1 through 86-N. The memory cell 86-7 which receives the program potential on word line WL7 suffers the largest program disturb condition. It is found that even after a program disturb event, such memory cells maintain a threshold below 0 V, preserving the read margin necessary for the cell. Because of the buried-channel implementation as described here, the pass voltages can be lower, and the conductivity of the string can be higher allowing for lower voltage operation of the device.

An erase bias arrangement applied using structures described below, includes a negative voltage across the word lines and semiconductor body of the memory cells, such as about −14 to −18 V with a pulse duration of about 10 ms.

To read a selected cell, relatively low pass voltages, let such as less than 5 V, are applied to unselected word lines, and to the SSL and GSL lines. A read potential is applied to the selected word line is between the threshold states of the memory cell.

FIG. 6 is a simplified diagram of a buried-channel, depletion mode charge trapping memory cell employing a band gap engineered dielectric tunneling layer. The memory cell includes a channel 90 comprising lightly doped n-type material (on the order of $5E17$ cm$^{-3}$), or an undoped material, in a relatively heavily doped p-type well to block a parasitic leakage path, in a p-type semiconductor body (on the order of 1E17 cm⁻³), and a source 91 and a drain 92 regions also n-type or undoped adjacent the channel.

A gate 98 in this embodiment comprises p+ polysilicon. N+ polysilicon may also be used. Other embodiments employ metals, metal compounds or combinations of metals and metal compounds for the gate 98, such as platinum, tantalum nitride, metal silicides, aluminum or other metal or metal compound gate materials. For some applications, it is preferable to use materials having work functions higher than 4.5 eV. A variety of high work function materials suitable for use as a gate terminal are described in U.S. Pat. No. 6,912,163, referred to above. Such materials are typically deposited using sputtering and physical vapor deposition technologies, and can be patterned using reactive ion etching.

In the embodiment illustrated in FIG. 6, the dielectric tunneling layer comprises a composite of materials, including a first layer 93, referred to as a hole tunneling layer, of silicon dioxide on the surface 90a of the channel 90 formed for example using in-situ steam generation ISSG with optional nitridation by either a post deposition NO anneal or by addition of NO to the ambient during deposition. The thickness of the first layer 93 of silicon dioxide is less than 20 Å, and preferably 13 Å or less.

A layer 94, referred to as a band offset layer, of silicon nitride lies on the first layer 93 of silicon oxide formed for example using low-pressure chemical vapor deposition LPCVD, using for example dichlorosilane DCS and $NH_3$ precursors at 680 degrees C. In alternative processes, the band offset layer comprises silicon oxynitride, made using a similar process with an $N_2O$ precursor. The thickness of the layer 94 of silicon nitride is less than 30 Å, and preferably 20 Å or less.

A second layer 95 of silicon dioxide, referred to as an isolation layer, lies on the layer 94 of silicon nitride formed for example using LPCVD high temperature oxide HTO deposition. The thickness of the second layer 95 of silicon dioxide is less than 30 Å, and preferably 25 Å or less.

A charge trapping layer 96 in this embodiment comprises silicon nitride having a thickness greater than 50 Å, including for example about 70 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on. A variety of charge trapping materials is described in the above referenced U.S. Patent Application Publication No. 2006/0261401 A1, entitled "Novel Low Power NonVolatile Memory and Gate Stack", by Bhattacharyya, published 23 Nov. 2006.

The blocking dielectric layer 97 in this embodiment comprises silicon dioxide, made using a thermal oxide or a CVD process or both, having thickness of about 70 Å in this embodiment. Alternative composite blocking layers including high-K and medium-K blocking layers can be used.

In a representative embodiment, the first layer 93 can be 1.3 nm of silicon dioxide; the band offset layer 94 can be 2 nm of silicon nitride; the isolation layer 95 can be 2.5 nm of silicon dioxide; the charge trapping layer 96 can be 8 nm of silicon nitride; and the blocking dielectric layer 97 can be 7 nm of silicon oxide. The gate material can be p+ polysilicon (work function about 5.1 eV). As a result of this multilayer structure, the tunnel insulating layer contacts a surface of the channel region, and comprises a combination of materials arranged to establish an inverted-U shaped valence band profile, including a relatively low valence band energy level (that of silicon dioxide) near the surface of the channel region, and an increase in valence band energy level (to that of silicon nitride) at a first distance of less than 2 nm (e.g. at 1.3 nm) from the surface of the channel region and a decrease in valence band energy (to that of silicon oxide) at a second distance (e.g. 3.3 nm) more than said first distance from the surface of the channel region. Other embodiments may not have clearly defined layer boundaries, but nonetheless produce an inverted-U shaped valence band profile.

Figure 7:
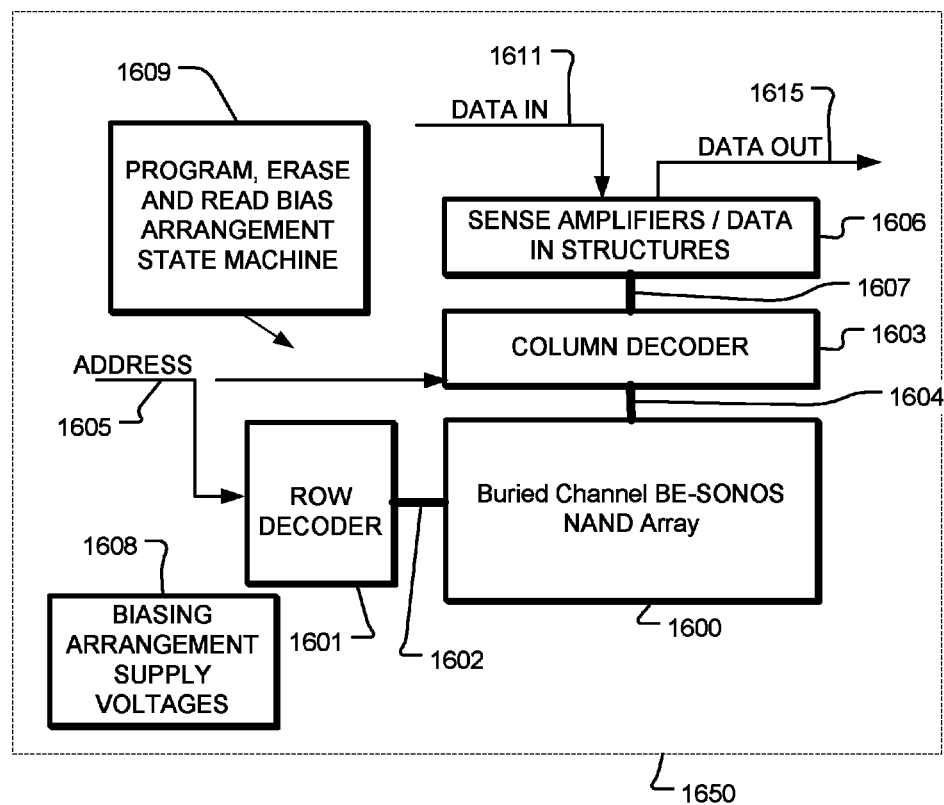
FIG. 7 is a simplified block diagram of an integrated circuit memory device including an array of buried-channel, BE-SONOS memory cells arranged in a NAND array.

FIG. 7 is a simplified diagram of an integrated circuit with an array of buried-channel, charge trapping memory cells as described herein, such as depletion mode FinFET BE-SONOS NAND flash. The integrated circuit 1650 includes a memory array 1600 implemented using nonvolatile memory cells as described herein on a semiconductor substrate. A row decoder 1601 is coupled to a plurality of word lines 1602 arranged along rows in the memory array 1600. Memory cells as described herein can be configured in NAND arrays. Other embodiments can be configured in NOR arrays, SOI AND arrays, or other types of array structures. A column decoder 1603 is coupled to a plurality of bit lines 1604 arranged along columns in the memory array 1600. Addresses are supplied on bus 1605 to column decoder 1603 and row decoder 1601. Sense amplifiers and data-in structures in block 1606 are coupled to the column decoder 1603 via data bus 1607. Data is supplied via the data-in line 1611 from input/output ports on the integrated circuit 1650, or from other data sources internal or external to the integrated circuit 1650, to the data-in structures in block 1606. Data is supplied via the data-out line 1615 from the sense amplifiers in block 1606 to input/output ports on the integrated circuit 1650, or to other data destinations internal or external to the integrated circuit 1650. A bias arrangement state machine 1609 controls the application of bias arrangement supply voltages 1608, such as for the erase verify and program verify voltages, and the arrangements for programming, erasing, and reading the memory cells. The bias arrangement state machine is adapted to apply bias arrangements for programming by +FN tunneling including a positive voltage between the gate and channel or between the gate and one or both of the source and drain terminals sufficient to induce electron tunneling through the tunnel dielectric structure into the charge trapping structure. Also, the bias arrangement state machine is adapted to apply bias arrangements for erasing by −FN tunneling including a negative voltage between the gate and channel or between the gate and one or both of the source and drain terminals sufficient to induce hole tunneling through the tunnel dielectric structure into the charge trapping structure.

The array may be combined on the integrated circuit with other modules, such as processors, other memory arrays, programmable logic, dedicated logic etc.

A buried-channel, depletion mode finFET BE-SONOS device is described. Contrary to conventional flash memory enhancement mode devices, a n-channel buried-channel device has a n-type top surface. Thus the initial threshold voltage $V_T$ is lowered so that it operates in a "normally-on" mode and shifts the erase and program state threshold distributions downward. The use of a finFET like structure enhances gate control capability and offers better scaling. Moreover, the buried-channel device provides better read current and transconductance characteristics, since the channel operates in a bulk inversion mode, rather than a conventional surface inversion of enhancement mode devices. Furthermore, the bulk inversion is less sensitive to the corner edge of the finFET ridge, so that better uniformity and less program and erase disturbance are achieved. The depletion mode device described here is suitable for junction-free embodiments allowing further scaling without the need for additional n+-type implants between the word lines, since the channel is already n-type.

In NAND flash, devices are normally erased to negative $V_T$ and then programmed to positive $V_T$. A novel depletion-mode (normally on) buried-channel, junction-free n-channel NAND flash device is described here. The buried-channel NAND flash shifts the program and erase P/E $V_T$ ranges below those for the conventional surface-channel device, and is more suitable for the NAND flash memory design. Due to the lower initial $V_T$, the device shows faster erase speed and higher immunity to read disturb. Furthermore, the buried-channel device has significantly improved cycling endurance, because the buried-channel is insensitive to the interface state (Dit) generation during program/erase stressing. A lightly doped shallow n-type channel serves both as the buried bit line and as the source/drain of the junction-free structure. The short channel effects are overcome by using finFET-like structures. The buried-channel NAND flash uses a simple program-inhibit method by directly raising the bit line potential without introducing a deep depletion as needed in the conventional self-boosting method.

BE-SONOS style charge trapping structures are preferred (e.g. as described with reference to FIG. 6) because they provide a fast erase next generation charge trapping device, and combined with a finFET-like structure for its excellent short channel control characteristics. In the following, some of the advantages are set forth of the buried-channel device, including:

(1) Faster erase speed to $V_T<0V$ and symmetrical $V_T$ distribution window: Due to the much lower initial $V_T$, it is naturally easier to erase the device to $V_T<0V$. This is especially useful for the charge-trapping devices since they generally have slower erase speed than the floating gate devices. The $V_T$ distribution is lower and more symmetrical for the buried-channel device and this benefits the NAND flash design.

(2) Larger disturb margins: Because of the lower initial $V_T$, both program and read disturb (under the same bottom oxide field and stress time) can be more easily controlled below $V_T<0V$ for larger disturb-free window. Moreover, lower pass-gate voltage (<5V) is required for read.

(3) Ideal for junction-free NAND: The n-type buried-channel can serve as a "buried bit line" that connects all devices together. Thus there is no need to fabricate an additional junction between WL's.

(4) Without complicated self-boosting program-inhibit method: Self-boosting is a complicated function of well and junction doping. See, Suh, et al., VLSI Symposia, pp. 86-87, 2006. It is also highly affected by the junction leakage. Therefore, it is a difficult choice between cell performance and self-boosting during the well/junction profile adjustment. Unlike the conventional surface channel device which must introduce deep depletion for self-boosting, it is very easy to directly raise the bit line potential (where all the n-type regions are connected together) for the buried-channel device.

(5) Improved cycling endurance: The buried-channel devices have significantly improved cycling endurance. This is because the inversion channel is away from the surface and thus is much less sensitive to the density of interface states (Dit) generated after cycling stressing. As a result, the $V_T$ roll-up after P/E cycling is greatly suppressed.

The program/erase P/E window for a buried-channel device is essentially a parallel shift toward lower $V_T$ relative to a more typical surface-channel device. The lower initial $V_T$ also makes the erase speed faster. Also, the P/E $V_T$ distribution is very symmetrical, with the low erase $V_T$ distribution offering a wider disturb-free window for NAND flash. Furthermore, the buried-channel device described here can be implemented as a multilevel cell MLC, so that each device stores two or more bits of data, where the erase state has a negative $V_T$ distribution, and the three or more program states have positive $V_T$ distributions.

Buried-channel devices show significantly improved endurance relative to the surface-channel devices in the FinFET structure.

The buried-channel device extends a high inversion electron density deep into the channel, while surface-channel shows only surface inversion. Thus buried-channel device is less sensitive to the density of interfacial states (Dit) at inversion.

While the preferred embodiments of the invention have been illustrated and described, it will be clear that the invention is not limited to these embodiments only. Numerous modifications, changes, variations, substitutions and equivalents will be apparent to those skilled in the art, without departing from the spirit and scope of the invention, as described in the claims.

What is claimed is:

1. A nonvolatile memory device comprising:
   a semiconductor substrate having a particular conductivity type;
   a plurality of semiconductor fins integral with the semiconductor substrate, the semiconductor fins including buried-channel regions doped for depletion mode operation having a first conductivity type opposite said particular conductivity type;
   a doped isolation region in the semiconductor fins having said particular conductivity type to separate the buried-channel regions from the semiconductor substrate, and wherein a first region of the semiconductor fin between the semiconductor substrate and the doped isolation region is more lightly doped than the doped isolation region;
   a storage structure on the plurality of semiconductor fins, including a tunnel insulating layer on the buried-channel regions of the semiconductor fins, a charge storage layer on the tunnel insulating layer, and a blocking insulating layer on the charge storage layer;
   a plurality of word lines on the storage structure and crossing over the buried-channel regions of the semiconductor fins, whereby memory cells lie at cross-points of the word lines and the semiconductor fins; and
   a controller and biasing voltage supply circuits, adapted to execute an erase operation including applying voltage across the word line and the buried-channel regions.

2. The device of claim 1, wherein the buried-channel regions are doped with a n-type dopant.

3. The device of claim 1, wherein the buried-channel regions are doped with the first conductivity type, and including doped source/drain regions on the semiconductor fins on opposite sides of said word lines, the doped source/drain regions having dopants of said first conductivity type in higher concentration than the buried-channel regions.

4. The device of claim 1, wherein said tunnel insulating layer of a particular memory cell contacts a surface of the buried-channel region of the particular memory cell, and comprises a combination of materials arranged to establish a relatively low valence band energy level near the surface of the buried-channel region, and an increase in valence band energy level at a first distance of less than 2 nm from the surface of the buried-channel region and a decrease in valence band energy at a second distance more than said first distance from the surface of the buried-channel region.

5. The device of claim 1, including an insulator between the word lines in the plurality of word lines.

6. The device of claim 1, including a particular fin in the plurality of fins includes an access transistor having a channel in said particular fin doped for enhancement mode operation.

7. The device of claim 1, wherein said memory cells are arranged in a NAND-array.

8. The device of claim 1, wherein said buried-channel regions of the memory cells have n-type dopant with a concentration less than $1\times10^{18}/cm^3$.

9. The device of claim 8, wherein the doped isolation regions in said plurality the semiconductor fins having p-type dopant with a concentration between $1\times10^{17}/cm^3$ and $1\times10^{18}/cm^3$, and said semiconductor substrate has p-type dopant.

10. The device of claim 1 including a controller and biasing voltage supply circuits, adapted to execute a program operation, an erase operation and a read operation, said erase operation including applying a negative voltage between the word line and the buried-channel regions to induce hole tunneling.

11. An integrated circuit memory device, comprising:
a semiconductor fin, which is integral with and extends away from a p-type semiconductor substrate and having a distal ridge, the semiconductor fin including a buried-channel region along the distal ridge doped with n-type dopant for depletion mode operation;
a doped p-type isolation region in the semiconductor fin to separate the buried-channel region from the semiconductor substrate, and wherein a first p-type region of the semiconductor fin between the semiconductor substrate and the doped p-type isolation region is more lightly doped than the doped p-type isolation region;
a plurality of memory cell gates arranged over the buried-channel region along the distal ridge of the semiconductor fin, the plurality of memory cell gates including a first memory cell gate and a last memory cell gate, with insulating members isolating memory cell gates in series from adjacent memory cell gates in the series;
a charge storage structure including dielectric charge trapping locations beneath more than one of the plurality of memory cell gates in the series, the charge storage structure including a multilayer tunnel insulating structure, a charge storage layer disposed above the tunnel insulating structure, and a blocking insulating layer disposed above the charge storage layer; and
a string select gate over the distal ridge of the semiconductor fin, spaced away from the first memory cell gate, and having a p-type channel region on the distal ridge of the semiconductor fin.

12. The device of claim 11, including doped source/drain regions on the semiconductor fin on opposite sides of memory cell gates in the plurality of memory cell gates, the doped source/drain regions having n-type dopants.

13. The device of claim 11, wherein said multilayer tunnel insulating layer contacts a surface of the buried-channel region, and comprises a combination of materials arranged to establish a relatively low valence band energy level near the surface of the buried-channel region, and an increase in valence band energy level at a first distance of less than 2 nm from the surface of the buried-channel region and a decrease in valence band energy at a second distance more than said first distance from the surface of the buried-channel region.

14. The device of claim 11, wherein the n-type dopant in said buried-channel region has a concentration less than $1\times10^{18}/cm^3$.

15. The device of claim 14, wherein the doped p-type isolation region in said semiconductor fin includes p-type dopant with a concentration between $1\times10^{17}/cm^3$ and $1\times10^{18}/cm^3$.

16. The device of claim 11, including a controller and biasing voltage supply circuits, adapted to execute a program operation, an erase operation and a read operation, said erase operation comprising including applying a negative voltage between a gate of a selected cell and the buried-channel region to induce hole tunneling.

\* \* \* \* \*

UNITED STATES PATENT AND TRADEMARK OFFICE
CERTIFICATE OF CORRECTION

PATENT NO.        : 8,860,124 B2                                                Page 1 of 1
APPLICATION NO.   : 12/553758
DATED             : October 14, 2014
INVENTOR(S)       : Hang-Ting Lue et al.

It is certified that error appears in the above-identified patent and that said Letters Patent is hereby corrected as shown below:

In the Claims

In claim 9, column 11, line 14, after the word "plurality", delete the word "the" and insert the word -- of --.

Signed and Sealed this
Twenty-sixth Day of May, 2015

Michelle K. Lee
*Director of the United States Patent and Trademark Office*